United States Patent
Tang et al.

[11] Patent Number: 5,805,502
[45] Date of Patent: *Sep. 8, 1998

[54] SYSTEM FOR CONSTANT FIELD ERASURE IN A FLASH EPROM

[75] Inventors: Yuan Tang, San Jose; Chi Chang, Redwood City; James C. Yu, San Jose, all of Calif.

[73] Assignee: Advanced Micro Devices, Inc., Sunnyvale, Calif.

[*] Notice: The term of this patent shall not extend beyond the expiration date of Pat. No. 5,629,893.

[21] Appl. No.: 795,024

[22] Filed: Feb. 4, 1997

Related U.S. Application Data

[63] Continuation of Ser. No. 634,512, Apr. 18, 1996, Pat. No. 5,629,893, which is a continuation of Ser. No. 440,046, May 12, 1995, abandoned.

[51] Int. Cl.[6] ................................................. G11C 13/00
[52] U.S. Cl. ........................ 365/185.29; 365/185.33; 365/218
[58] Field of Search ................ 365/185.29, 185.33, 365/218

[56] References Cited

U.S. PATENT DOCUMENTS

| | | | |
|---|---|---|---|
| 4,884,239 | 11/1989 | Ono et al. | 365/185.29 X |
| 5,042,009 | 8/1991 | Kazeroumian et al. | 365/189.01 X |
| 5,485,423 | 1/1996 | Tang et al. | 365/185.29 X |
| 5,561,620 | 10/1996 | Chen et al. | 365/218 |
| 5,629,893 | 5/1997 | Tang et al. | 365/185.29 |

*Primary Examiner*—Do Hyun Yoo
*Attorney, Agent, or Firm*—Sawyer & Associates

[57] ABSTRACT

A FLASH EPROM cell in accordance with the present invention is disclosed in which the erasure is accomplished under a constant electric field. The FLASH EPROM cell includes a semiconductor device including a source, a drain and a gate and a constant current circuit coupled to the source. The constant current circuit ensures that a constant field is applied to the tunneling oxide of the FLASH EPROM cell during erasure thereof. In so doing, the FLASH EPROM cell can be erased with a minimum of stress to the device. In addition, the FLASH EPROM cell of the present invention can be used with various power supplies without affecting the characteristics thereof. Finally, through the FLASH EPROM cell of the present invention, the short channel effect associated with smaller device sizes can be substantially reduced.

3 Claims, 3 Drawing Sheets

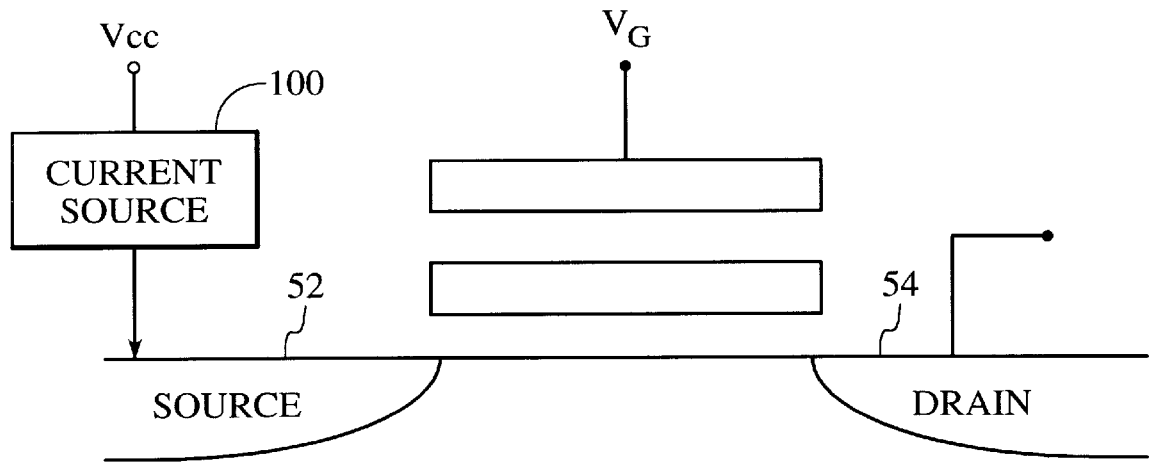
FIG. 2 <u>50</u>
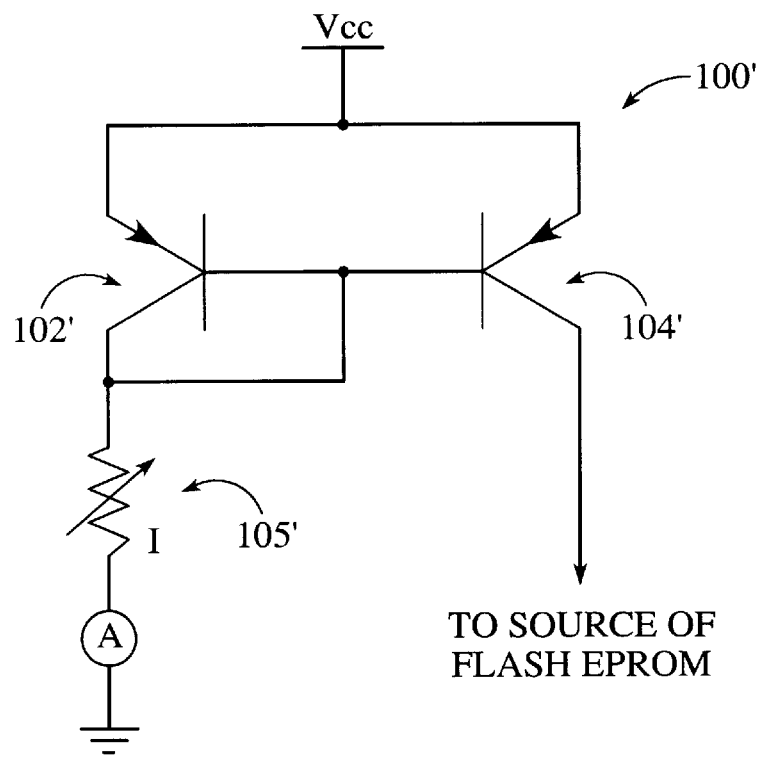
FIG. 3

SYSTEM FOR CONSTANT FIELD ERASURE IN A FLASH EPROM

This is a continuation of application Ser. No. 08/634,512 filed on Apr. 18, 1996 now U.S. Pat. No. 5,390,893 which is a FWC of Ser. No. 08/440,046 filed on May 12, 1995, now abandoned.

FIELD OF THE INVENTION

The present invention relates to FLASH EPROM devices, and more particularly, to an improvement in the erasure thereof.

BACKGROUND OF THE INVENTION

The data in a FLASH EPROM device is conventionally erased by providing a constant voltage to the source of the device. It is very important that the electric field across the tunneling oxide generated thereby remain constant as nearly as possible during erasure so as not to put undue stress on the tunneling oxide. It is known that if a voltage potential is applied directly to the source of the FLASH EPROM, that an unacceptable amount of stress is exerted on the oxide because the very high peak field generated at the beginning of the erasure.

When a load resistance is placed between the voltage supply and the source of the FLASH EPROM the electric field generated thereby generates less stress than when no load resistor is provided. However, even when utilizing this arrangement, stress is still present because the electric field generated thereby is still not a constant value.

In addition, as the size of the device decreases, another problem, known as short channel effect also becomes significant. That is, it is known that hot carriers are generated due to a lateral electrical field in the channel between the source and the drain of the device. At the larger device sizes, i.e., when the channel between the source and drain is long, the transient electrical field generated is very small during that charging period, i.e., the period when the voltage is applied to the source. However, as the channel becomes shorter, then these hot spots can be created more easily. The prior art constant voltage supply arrangement for the FLASH EPROM cell becomes harmful in this aspect due to the high field generated at the beginning of the erasure.

A third problem associated with known FLASH EPROM devices when erased is that they are not easily able to be adjusted to various voltage supplies. Hence, if the power supply that is provided to the device is a five volt power supply, but in fact, the device itself is a three volt device, complicated circuitry is required to bring the voltage down to a level which can be properly utilized with the three volt device. Accordingly, known systems require complicated circuitry to either ramp up or lower the voltage of the device to provide a constant electric field.

In addition, it is known that the endurance of EPROM devices is affected by electron trapping in the tunneling oxide. This becomes a bigger problem as the device sizes become smaller.

Finally, it is important as power requirements are reduced on semiconductor devices to provide ways to reduce the peak field necessary for erasure.

What is needed, therefore, is a circuit that would allow for a constant field to be provided during erasure of a FLASH EPROM device while at the same time would overcome the above-identified problems associated with short channel effect and varying voltage supplies. The present invention addresses such a need.

SUMMARY OF THE INVENTION

A FLASH EPROM cell in accordance with the present invention is disclosed in which the erasure is accomplished under a constant electric field throughout the duration of the erasure. The FLASH EPROM cell comprises a semiconductor device including a source, a drain and a gate and a constant current means coupled to the source. The constant current means ensures that a constant field is applied across the tunneling oxide of the FLASH EPROM cell during erasure thereof.

In so doing, the FLASH EPROM cell can be erased with a minimum of stress to the tunneling oxide and source junction of the device. In addition, the FLASH EPROM cell of the present invention can be used with various power supplies without affecting the characteristics thereof. In addition, there is a significant reduction of electron trapping in the tunnel oxide which improves the endurance of the cell. Also, the cell has a reduced peak band-to-band tunneling current at the beginning of erasure, thereby allowing for lower power of operation than conventional erasure method. Finally, through the FLASH EPROM cell of the present invention, the short channel effect associated with smaller device sizes can be substantially reduced.

BRIEF DESCRIPTION OF THE DRAWINGS

FIG. 2 is a block diagram of a FLASH EPROM cell with a constant field erasure circuit in accordance with the present invention.

FIG. 3 is a schematic diagram of one embodiment of the constant field erasure circuit in accordance with the present invention.

DESCRIPTION OF THE INVENTION

The present invention is directed toward a FLASH EPROM cell in which the electric field is constant during erasure. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
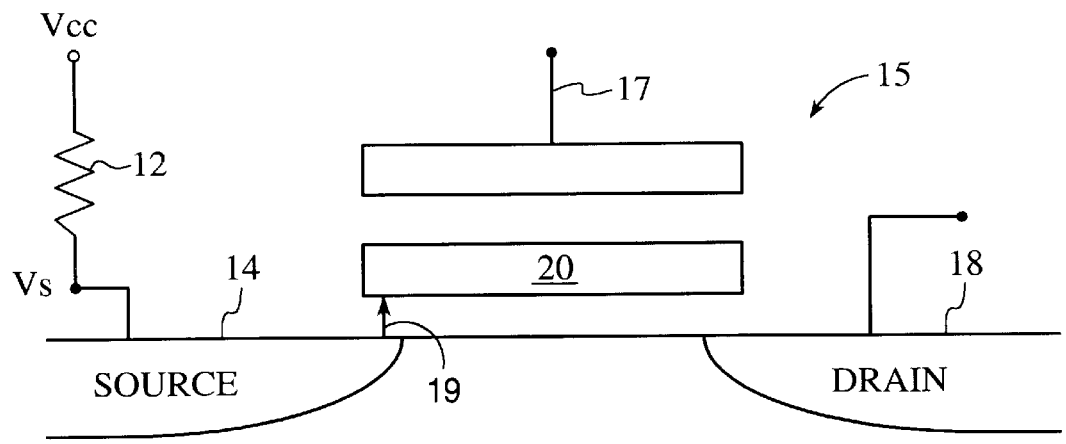
FIG. 1 is a schematic diagram of a conventional circuit for erasing a FLASH EPROM cell.

FIG. 1 shows a prior art constant voltage erasure system 10. Such a system 10 comprises a voltage $V_{CC}$ applied to a load resistor 12. The load resistor 12 is in turn coupled to the source 14 of the FLASH EPROM cell 15 and a voltage is applied to the gate 17 of the cell 15. The drain 18 of the cell 15 is floating. In such a system as has been before described, the field across the tunnel oxide during erasure is not constant, thereby causing stress on the FLASH EPROM cell 15.

As has also been mentioned, the conventional load resistor arrangement also does not adequately address the problems with short channel effect and varying voltage supplies without the addition of expensive and complicated circuitry.

Figure 1A:
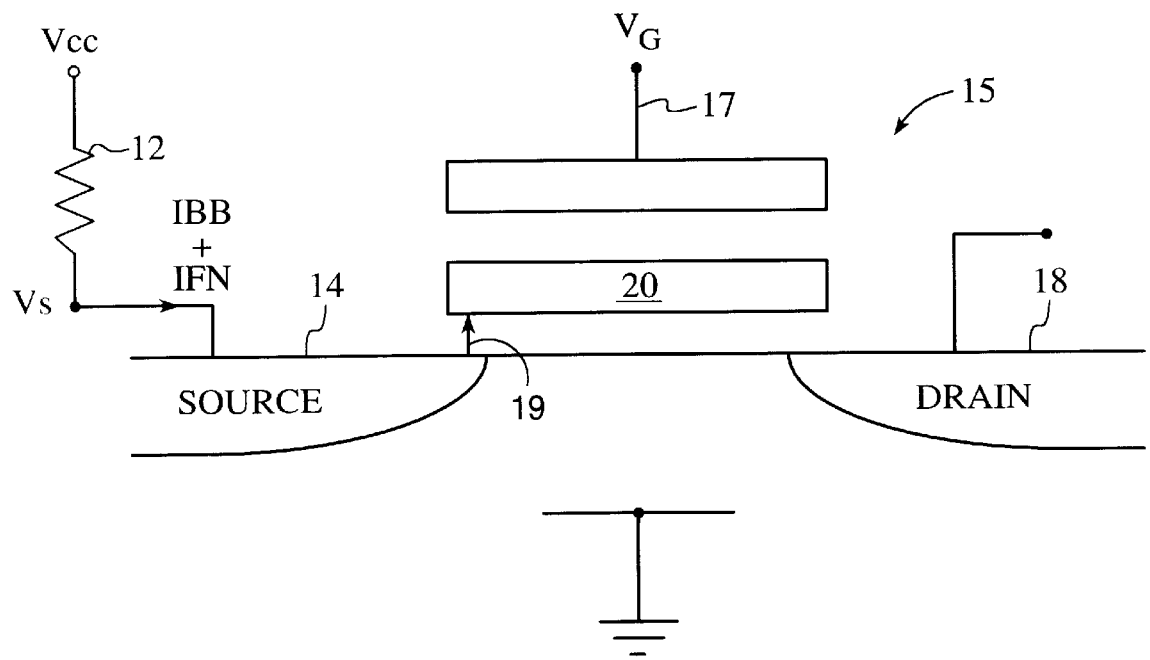
FIG. 1a is a schematic diagram of a typical FLASH EPROM cell.

It is known that during the erase condition shown in FIG. 1a, a band-to-band tunneling current ($I_{BB}$) from source to substrate is associated with the Fowler-Nordheim (F-N) tunneling current from floating gate 20 to the source 14 (shown at 19). The current $I_S$ supplied by power supply composed of $I_{FN}$ and $I_{BB}$. $I_{BB}$ is in the order microamps (uA) while $I_{FN}$ is in the order of pcoamps (cA), therefore $I_{FN}$ is negligible compared to $I_{BB}$. Accordingly, $I_S$ for all intents and purpose is equal to $I_{BB}$.

Both $I_{FN}$ and $I_{BB}$ are functions of F-N tunneling field 19 in the source/gate overlap region, i.e., the stronger the tunneling field, the larger the current. Therefore Applicant have discovered that if $I_{BB}$ can be kept constant during erasure, the electric field during erasure can be kept constant.

Referring now to FIG. 2, what is shown is an improved FLASH EPROM cell 50 including a constant current circuit 100 coupled between the power supply ($V_{CC}$) and the source 52 of the FLASH EPROM cell 50. It is known that if the tunneling electric field is kept constant, then the peak tunneling field hence the stresses on the device will be significantly reduced. Accordingly, by providing a constant current to the source 52 of the FLASH EPROM cell 50 rather than the constant voltage/load resistor arrangement of the prior art, the field generated thereby remains constant. In so doing the stress on the device caused by conventional erase circuits is substantially eliminated without requiring complicated circuitry to maintain the constant field.

Referring now to FIG. 3, what is shown is a current circuit 100' which is one implementation of a constant current circuit 100 in accordance with the present invention. The current mirror circuit 100' includes first and second transistors 102' and 104' coupled in a current mirror configuration which is coupled to $V_{CC}$, and a variable load resistor 105' which in turn is coupled to ground. The source of transistor 104' is in turn coupled to the source of a FLASH EPROM cell or an array of cells.

Figure 4:
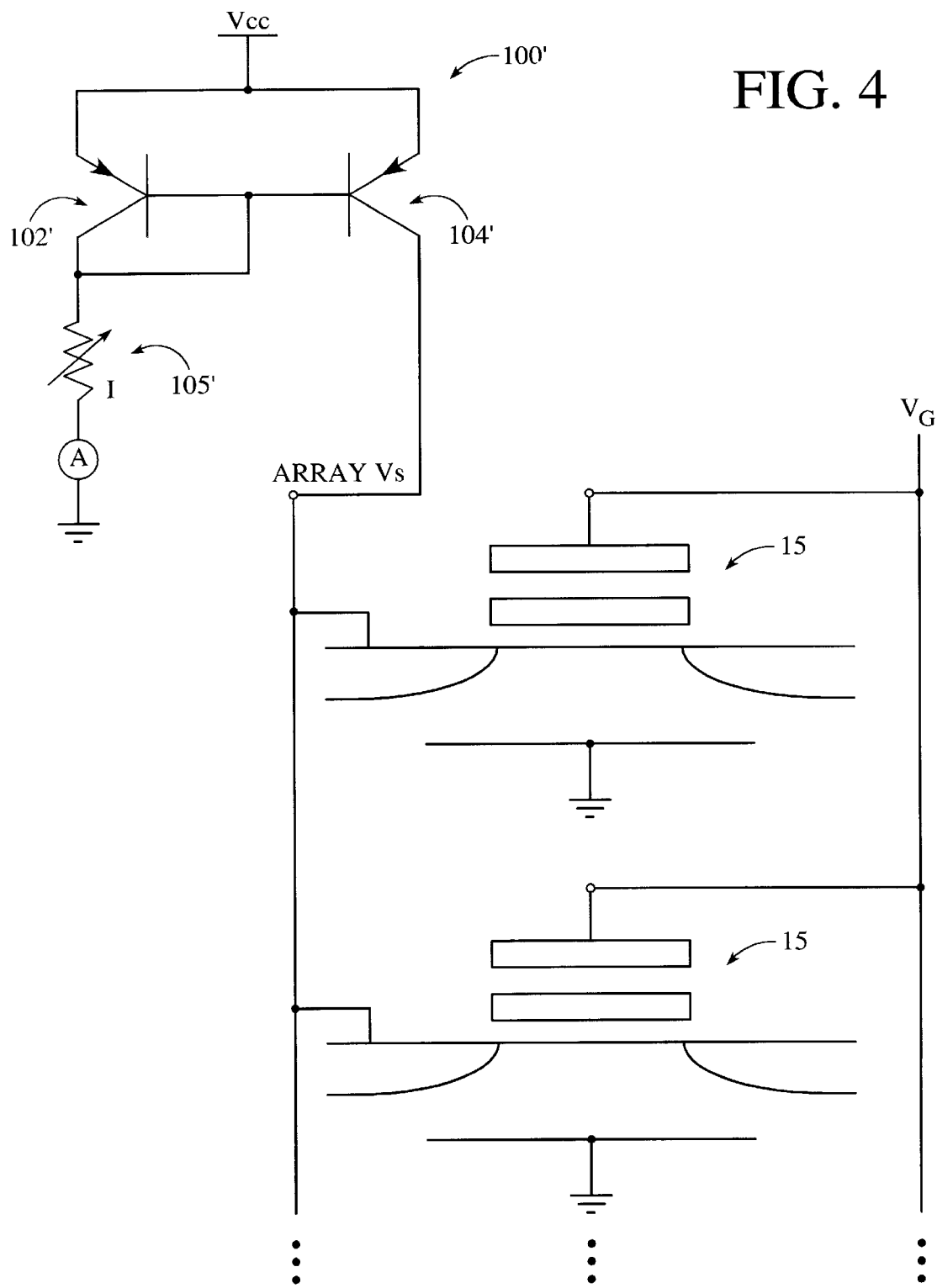
FIG. 4 is a schematic diagram of an array of FLASH EPROM cells that are utilized with a constant field erasure system in accordance with the present invention.

This current mirror circuit 100' could be utilized advantageously with an array of FLASH EPROM cells 15 as shown in FIG. 4. As is seen a constant current is commonly connected to the sources of the plurality of cells 15 via the source of transistor 104'. It should be understood that although a current mirror circuit is shown as providing the constant current, a variety of other circuits could be utilized and their use would be within the spirit and scope of the present invention.

Compared to other approaches to maintaining a constant erase field, the current source approach has the following main advantages:

1. Simplicity: There is no need to design circuits with complex features like ramping or varying values as functions of erase time.
2. Small Ramp Step: During erasure with current source, $V_{CC}$ is actually ramping continuously. The $V_{CC}$ initial value and ramping rate is automatically determined by the current and the ramping step is infinitely small.
3. Self-adjustable Erase Field: When an array is weakened by electronic trapping it can now be strengthened by the current source circuit. In one example it has been found that when the erase cycling is beyond 500–4000 cycles, F-N tunneling will cause electron trapping in gate/source overlap region away from junction corner. While band-band tunneling always induces hole trapping in a junction corner overlap region. The hole trapping will in turn reduce band-to-band tunneling. In order to keep band-to-band tunneling current, the current source will automatically ramp more source voltage to increase the oxide tunneling field which will strengthen the F-N tunneling weakened by the electron oxide trapping in a region away from the junction corner.
4. Power Supply Flexibility: The current source approach can be adapted to different power supplies. By utilizing the current source approach the current can be kept constant by simply adjusting the resistor in FIG. 3 independent of the power supply. Therefore the electric field will remain constant and erase time will remain the same.

At smaller gate lengths and thinner tunneling oxide layers if the constant voltage approach is utilized, the voltage drop on the load resistor is going to be too large due to $I_{BB}$; therefore erase will be too slow. If the load resister is not used, peak field is going to be too high and the tunneling oxide will be damaged. Therefore, by using a constant current circuit in accordance with the present invention, which is equivalent to a constant voltage source and a variable load resistor, the array $V_S$ can ramp more during erase than either of the conventional erase systems.

The two advantages of a constant field erase are automatically achieved by the current source approach.

1. Significant reduction of electron trapping during erasure due to reduction of peak tunneling field. Therefore, the endurance of the device is significantly increased.
2. Significant reduction of peak band-to-band tunneling current during erasure. Therefore, a device can operate at lower power, thereby reducing the size of the internal charge pump.

Accordingly through the present invention, a constant field is applied through the use of a constant current source thereby substantially reducing stress on the device. Through the application of a constant current to the source of the FLASH EPROM cell, the cell can be erased under a constant electric field throughout the duration of the erasure cycle despite changes in power supply levels and the erase time will remain the same. In addition, a system in accordance with the present invention substantially reduces the short channel effect as device sizes become smaller.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A FLASH EPROM cell comprising:

a Flash device including a source, a drain and a gate; and a constant current source means coupled to the source, the constant current source means for ensuring that a constant field is applied to tunneling oxide of the FLASH EPROM cell during erasure thereof.

2. A constant field erasure system comprising:

a FLASH device including a source, a drain and a gate;

a power supply for supplying current; and a constant current source means coupled between the source and the power supply during erasure of the FLASH device, the constant current source means for ensuring that a constant field is applied to tunneling oxide of the FLASH device, thereby improving the endurance of the FLASH device.

3. A constant field erasure system comprising:
- a plurality of FLASH device cells; each of the FLASH device cells comprising a source, a drain and a gate;
- a power supply for supplying current; and
- a constant current source means coupled between the source of each of the FLASH device cells and the power supply during erasure of the FLASH device cells for ensuring that a constant field is applied to the source/drain region of each of the FLASH device cells, thereby improving the endurance of the FLASH device cells.

* * * * *